(12) United States Patent
Tiuraniemi

(10) Patent No.: US 6,693,470 B1
(45) Date of Patent: Feb. 17, 2004

(54) METHOD AND ARRANGEMENT FOR GENERATING CYCLIC PULSES

(75) Inventor: Sakari Tiuraniemi, Oulu (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/304,915

(22) Filed: Nov. 27, 2002

(51) Int. Cl.[7] .............................................. H03B 21/00
(52) U.S. Cl. ....................................... 327/129; 327/100
(58) Field of Search ................................ 327/129, 100, 327/72, 75, 78, 231

(56) References Cited

U.S. PATENT DOCUMENTS 4,223,270 A * 9/1980 Schmid et al. ................. 327/33
4,555,673 A * 11/1985 Huijsing et al. ............. 330/258
5,873,046 A * 2/1999 Bronner ....................... 455/553

* cited by examiner

Primary Examiner—Dinh T. Le
(74) Attorney, Agent, or Firm—Squire, Sanders & Dempsey L.L.P.

(57) ABSTRACT

The invention relates to a method and an arrangement for generating cyclic pulses. A first differential pair includes an input for a first unipolar pulse, and a second input for a second unipolar pulse, the first unipolar pulse and the second unipolar pulse having inversed polarities with respect to each other. The first unipolar pulse and the second unipolar pulse are delayed in a delaying means, and a second differential pair includes an input for the first delayed unipolar pulse, and a second input for the second delayed unipolar pulse. The arrangement is configured to form a cyclic pulse by combining an output signal relating to the first unipolar pulse of the first differential pair with an output signal relating to the second unipolar pulse of the second differential pair.

20 Claims, 4 Drawing Sheets

METHOD AND ARRANGEMENT FOR GENERATING CYCLIC PULSES

BACKGROUND OF THE INVENTION

1. Field of the Invention

The invention relates to a method and an arrangement for generating cyclic pulses.

2. Description of the Related Art

Cyclic pulses are needed in many technical fields, such as ultra wide band technology (UWB). A cyclic pulse has both positive and negative amplitudes and can be a bipolar pulse, such as a monocycle or a pulse with several cycles. Cyclic pulses can be produced in several ways. A transistor operated in an avalanche mode produces monocyclic pulses, but as the avalanche breakdown does not take place in the same way each time and as it is sensitive to temperature and other environmental changes, the correlation of the pulses tend to be too low. The solution is also sensitive to noise, requiring a high operational-voltage, which prevents its use in portable devices.

Monocyclic pulses can also be generated with the help of transmission lines. In the solution, a unipolar pulse is divided into two transmission lines. The pulses experience different delays while propagating in the transmission lines and the other line also inverses the polarity of the pulse. The pulses of different transmission lines are then combined, resulting in a monocycle. Also this solution has many problems. The solution is sensitive to noise caused by power supplies, external radiation and circuits connected thereto. The solution may also produce even order harmonics which cannot be suppressed and hence cause big problems. Additionally, the transmission lines cannot be implemented on an integrated circuit, which makes it difficult and too large for many applications, such as portable devices.

It is also possible to generate monocyclic pulses by combining two unipolar pulses in a Gilbert multiplier, which multiplies one input unipolar pulse by one and the other unipolar pulse by minus one. The multiplying factors can be changed, depending on the data bit controlling the multiplication. The multiplying factors define the polarity of the pulses to be combined and, hence, by changing the multiplying factors from one to minus one, or vice versa, the phase of the output monocycle can be changed. The operation principle of a Gilbert multiplier is complicated and, thus, susceptible to problems.

SUMMARY OF THE INVENTION

It is an object of the invention to provide an improved solution which is simpler and more immune to disturbances. This is achieved by a method for generating cyclic pulses, the method comprising: inputting a first unipolar pulse to one input of a first differential pair; inputting a second unipolar pulse to another input of the first differential pair, the first unipolar pulse and the second unipolar pulse having inversed polarities with respect to each other; delaying the first unipolar pulse and the second unipolar pulse; inputting the first delayed unipolar pulse to one input of a second differential pair; inputting the second delayed unipolar pulse to another input of the second differential pair; and forming a cyclic pulse by combining an output signal relating to the first unipolar pulse of the first differential pair with an output signal relating to the second unipolar pulse of the second differential pair.

The invention also relates to an arrangement for generating cyclic pulses, the arrangement comprising: a first differential pair including an input for a first unipolar pulse, and a second input for a second unipolar pulse, the first unipolar pulse and the second unipolar pulse having inversed polarities with respect to each other; means for delaying the first unipolar pulse and the second unipolar pulse; a second differential pair including an input for the first delayed unipolar pulse, and a second input for the second delayed unipolar pulse; and the arrangement is configured to form a cyclic pulse by combining an output signal relating to the first unipolar pulse of the first differential pair with an output signal relating to the second unipolar pulse of the second differential pair.

Preferred embodiments of the invention are described in the dependent claims.

The method and arrangement of the invention provide several advantages. Since the solution is based on a differential pair it is rather insensitive to many kinds of interferences such as noise from other electronic devices or circuits or harmonic signals. Successive cyclic pulses are also very constant with little variation.

BRIEF DESCRIPTION OF THE DRAWINGS

In the following, the invention will be described in greater detail with reference to the preferred embodiments and the accompanying drawings, in which.

DESCRIPTION OF THE PREFERRED EMBODIMENTS

Figures 1A, 1B:
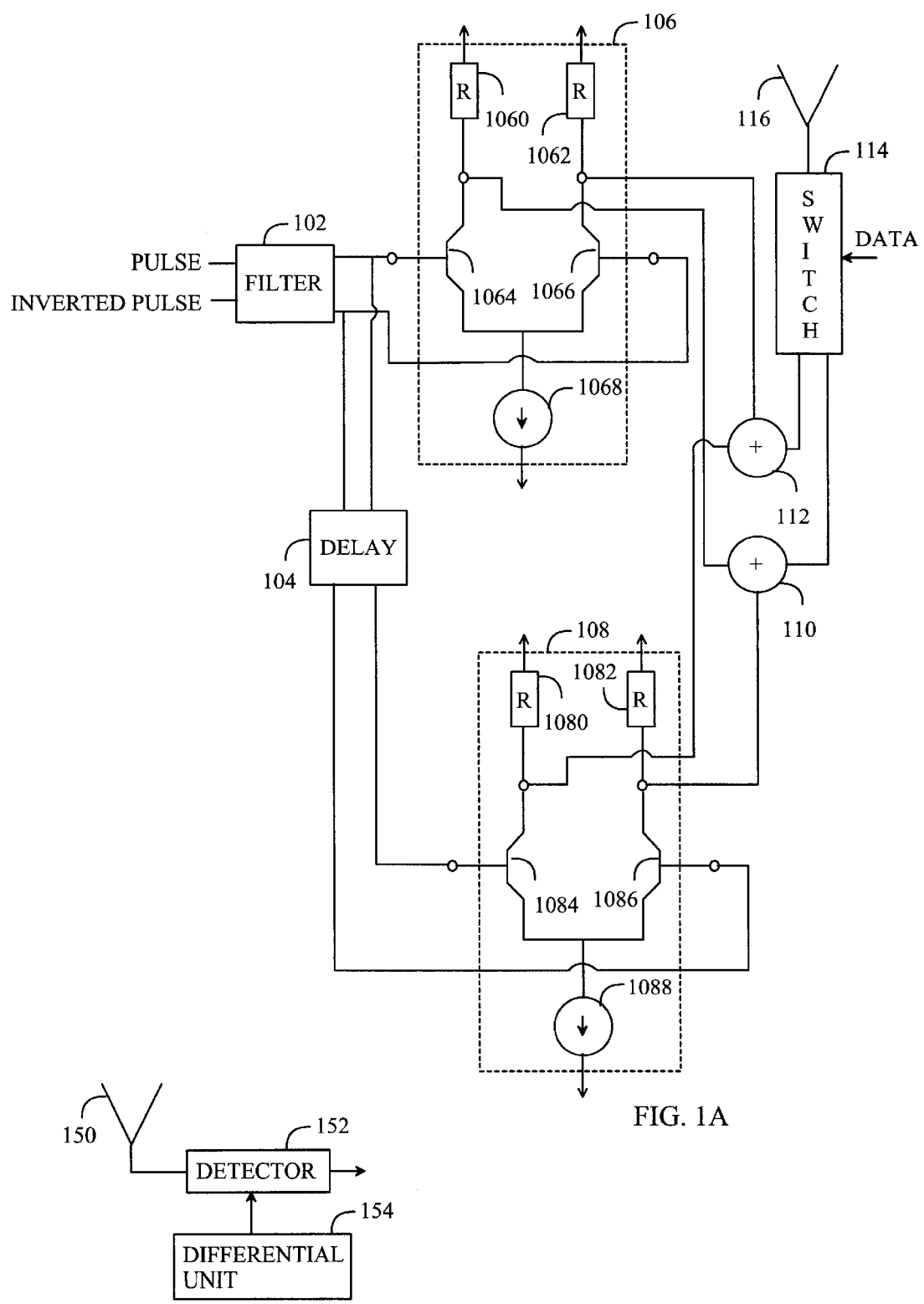
FIG. 1A shows a transmitter of a UWB radio.
FIG. 1B shows a receiver of a UWB radio.

The presented solution can be applied in a wide range of technologies such as a UWB radio, spread spectrum applications, radar systems, imaging applications for seeing through walls, medical applications for detecting tumours or organs etc, without, however, being limited to these.

With reference to FIG. 1, examine as an example the principal parts of a transmitter of a UWB radio. A sequence of unipolar pulses is input to the present arrangement. The unipolar pulses, the amplitudes of which have only one sign (i.e. the amplitudes have either non-negative or non-positive values), can be clock pulses. The pulse and the inverted pulse are fed to a pulse forming circuit 102, which produces pulses for a first differential pair 106. The pulse forming circuit 102 is a filter which filters the shape of the pulses, Gaussian pulse often being the desired shape. The pulse forming circuit 102 outputs unipolar pulses of inversed polarities with respect to each other, and the pulses are fed to the inputs of the first differential pair 106. The pulse forming circuit 102 is not necessarily needed but it is optional. A differential pair per se is well known in the art. The differential pair 106, which shows the basic structure of a differential pair, includes two resistors 1060, 1062, two transistors 1064, 1066, and a current source 1068. The transistors 1064, 1066 are coupled through resistors 1060, 1062 to the positive pole of the power source and the emitters (or sources) of the transistors are coupled to the current source 1068 coupled to the negative pole of the power source. The current source 1068 can also be a transistor. The transistors can be bipolar junction transistors (BJT) or field effect transistors (FET).

The pulse and the inverted pulse from the pulse forming circuit 102 are fed into a delay circuit 104, which delays the pulses by a delay time that corresponds to the duration of the pulses or any desired delay time. The delay time has an effect on the shape of the cyclic pulse, but the operation of the arrangement is not limited to any delay time. The delayed pulses then enter the inputs of the second differential pair 108, which is similar to the first differential pair 106. The basic version of the differential pair 108 includes two resistors 1080, 1082, two transistors 1084, 1086 and a current source 1088 coupled in the same way as the corresponding components in the first differential pair 106.

The outputs of the differential pairs 106, 108 are in collectors (or. drains) of the transistors 1060, 1062, 1080 and 1082. A cyclic pulse, which can also be considered as a wavelet, is formed by combining the output signal relating to the non-inverted unipolar pulse of the first differential pair 106 (i.e. output of transistor 1060) with an output signal relating to the inverted unipolar pulse of the second differential pair 108 (i.e. output of transistor 1082) in a, combiner 110. A cyclic pulse can also be formed by combining the output signal relating to the inverted unipolar pulse of the first differential pair 106 (i.e. output of transistor 1062) with an output signal relating to the non-inverted unipolar pulse of the second differential pair 108 (i.e. output of transistor 1080) in a combiner 112. The combiners 110, 112 can be analog adders which per se are well known in the art. Since the combiners can be realized in a simple way, the circuitry and the operation are reliable. The cyclic pulses from the combiners 110, 112 have opposite phases. The cyclic pulses can be used in a wide variety of technical fields.

In the UWB radio system, the pulses can be coupled to an antenna 116 one at a time by a switch 114. If the cyclic pulse at the output of the adder 110 is the digital "1" and the cyclic pulse at the output of the adder 112 is the digital "0", a bit sequence of digital data can be transmitted by switching the pulses in correct order to the antenna 116. Hence, the operation of the switch 114 is controlled by the information to be transmitted. Instead of coupling the pulses alternatively to the antenna, only one of the pulses can be used in the UWB radio system. Then, the switch 114 can couple a pulse to the antenna 114 or the switch 114 can block a pulse to be coupled to the antenna 116. In such a case the transmission of the pulse means the digital "1" and the blocking of the transmission of the pulse means the digital "0" or vice versa. Since the solution is capable of producing two cyclic pulses at a time, it is easy to use BPAM (Binary Pulse Amplitude Modulation) or it enables parallel functionality which saves area on the integrated circuit. The presented solution can also be used for example in PPM or PTM applications (Pulse Position Modulation, Pulse Time Modulation). In such a case, the pulse position can be controlled before inputting the pulses to the differential pair for example in the filter 102. Also in such a case no combiners 110, 112 and no switch 114 are used. In the UWB radio system, the duration of the pulses can be less than a microsecond and their frequency of occurrence can be dozens of millions of herz. The average transmission power can be dozens of milliwatts. The present solution, however, is not limited to any specific duration, frequency or power.

FIG. 1B presents a receiver of the UWB radio system. The receiver includes an antenna 150, a detector 152 and a differential unit 154. The differential unit 154 comprises the pair of differential pairs described in FIGS. 1A, 2, 4A or 4B. The antenna 150 receives a UWB signal and the UWB signal enters the detector 152, which correlates the signal with the cyclic pulses produced by the differential unit 154. The detector 152 detects information based on the correlation and forwards the information. The correlation can be performed by a correlator or a matched filter in the detector 152. The cyclic pulses produced by the differential unit 154 must have more crossings over zero (see FIGS. 4A, 4B and 5) than the cyclic pulses at a transmitter (see FIG. 3C) due to derivative effects related to the transmission.

Figure 2:
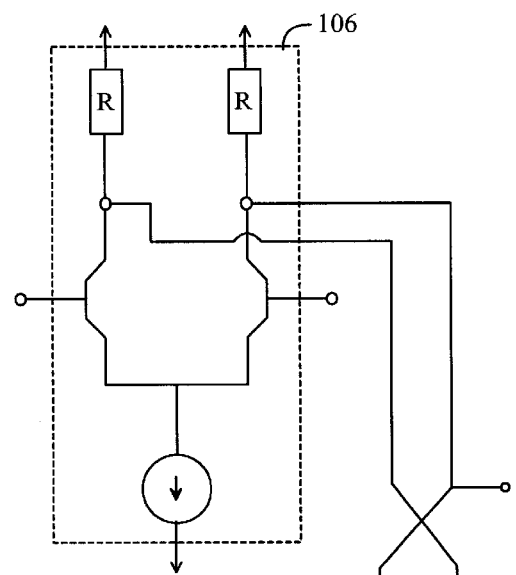
FIG. 2 shows a simple circuit for producing cyclic pulses.

FIG. 2 presents a collector cross coupling of the output signals of the differential pairs. Since a cross coupling sums the signals analogically instead of the analog adder, the coupling can be used as a combiner. Additionally, no resistors 1080, 1082 (in FIG. 1A) are necessarily needed because the values of the resistors 1060, 1062 can be selected such that they correspond to the value of the shunt coupling.

Figure 3A:
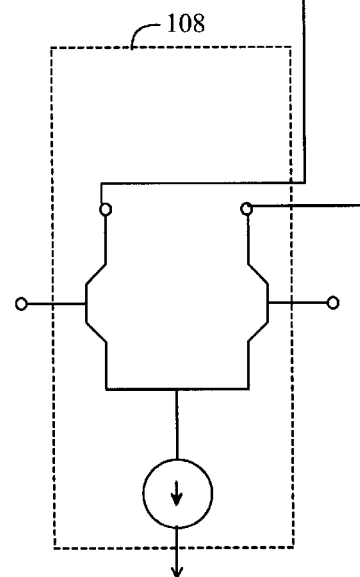
FIG. 3A shows a principle of a circuitry for producing narrow pulses from clock pulses for differential pairs.
Figure 3A:
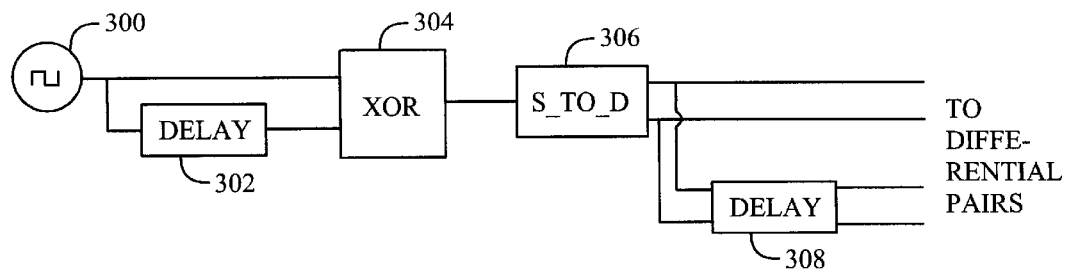
Figure 3B:
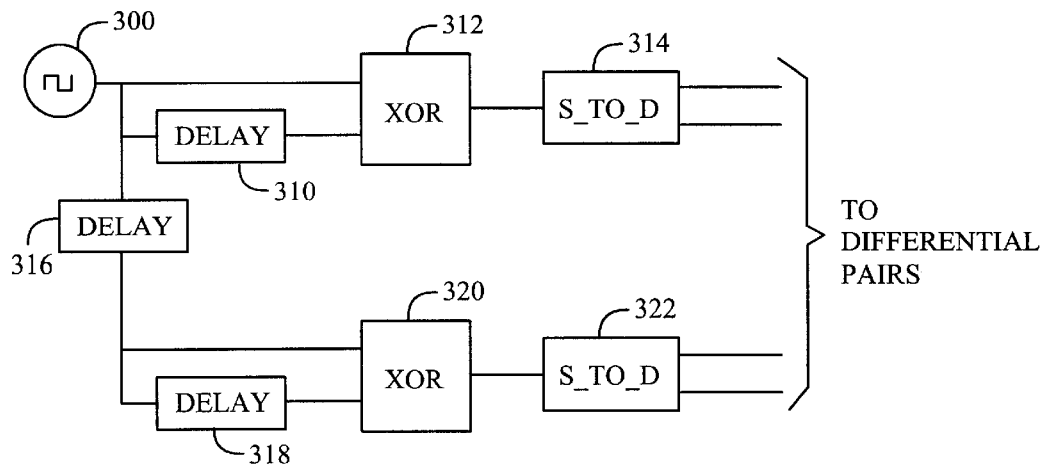
FIG. 3B shows a block diagram of a circuitry for producing narrow pulses from clock pulses for differential pairs.

FIGS. 3A and 3B present solutions in which the unipolar pulses for the differential pairs are formed from the clock pulses. The clock pulses can be fed to the differential pairs as such but often it is necessary to reduce the pulse width. In FIG. 3A, a clock 300 produces clock pulses and the pulses enter an XOR-gate 304. The clock pulses are also fed to a delay component 302 and delayed in order to produce a desired phase shift. The duration of the delay is a fraction of the clock cycle. The XOR-gate 304 outputs pulses the whose duration corresponds to the delay in the delay component 302. For example, if the delay component 302 delays the clock pulses by 10% of the width of the clock pulse, the width of the output pulse of the XOR-gate 304 is 10% of the width of the clock pulse (see FIG. 3C). The single-end-to-differential circuit 306, which is well known per se in the art, produces two pulses from the input pulse. The first output pulse of the single-end-to-differential circuit 306 is similar to the input pulse, and the second output pulse of the single-end-to-differential circuit 306 is an inversed pulse of the input pulse. These two pulses are then fed to the first differential pair. The output pulses of the single-end-to-differential circuit 306 are also delayed in a delay circuit 308, which is similar to the delay circuit 104. The delayed pulses are then fed to the second differential pair.

FIG. 3B shows a configuration for producing short pulses from the clock pulses using, for instance, CMOS 0.35 $\mu$m technology. The clock 300 outputs clock pulses in the similar manner as in FIG. 3A. The pulses are fed to the XOR-gate 312. The pulses delayed in a delay component 310 are also fed to an XOR-gate. The width of the output pulses are determined by the delay in the delay component 310 in the same manner as in FIG. 3A (relating to the components 302 and 304). The short pulses from the XOR-gate 312 then enter a single-end-to-differential circuit 314, which produces two pulses, the first of the pulses being similar to the input pulse and the second pulse being an inversed pulse of the input pulse. The two pulses are fed to the inputs of the first differential pair.

The pulses for the second differential pair can be produced in the following way. First, the clock pulse is delayed in the delay component 316. This delay corresponds to the delay of the delay component 308 in FIG. 3A and to the delay of the delay component 104 in FIG. 1. Otherwise the pulses for the second differential pair are produced in the same manner as the pulses for the first differential pair using the delay component 318, an XOR-gate 320 and a single-end-to-differential circuit 322.

Figure 3C:
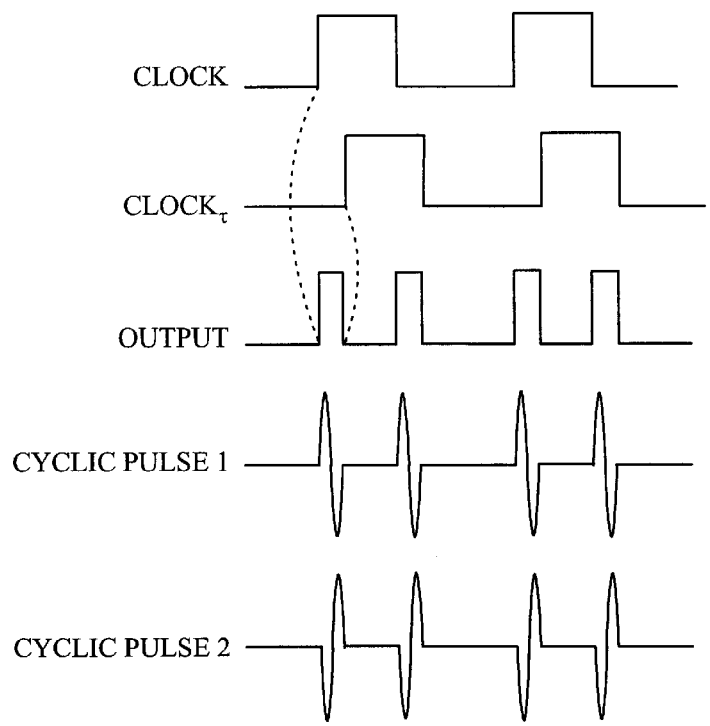
FIG. 3C shows a pulse chart of various signals.

FIG. 3C shows a pulse chart of the inputs and the output of an XOR-gate. The length of the phase shift between the clock pulses CLOCK and the delayed clock pulses CLOCK, corresponds to the duration of the output pulses OUTPUT of the XOR-gate. Cyclic pulses CYCLIC PULSE 1 and CYCLIC PULSE 2, which have opposite phases to each other, are the outputs of the differential pairs.

Figure 4A:
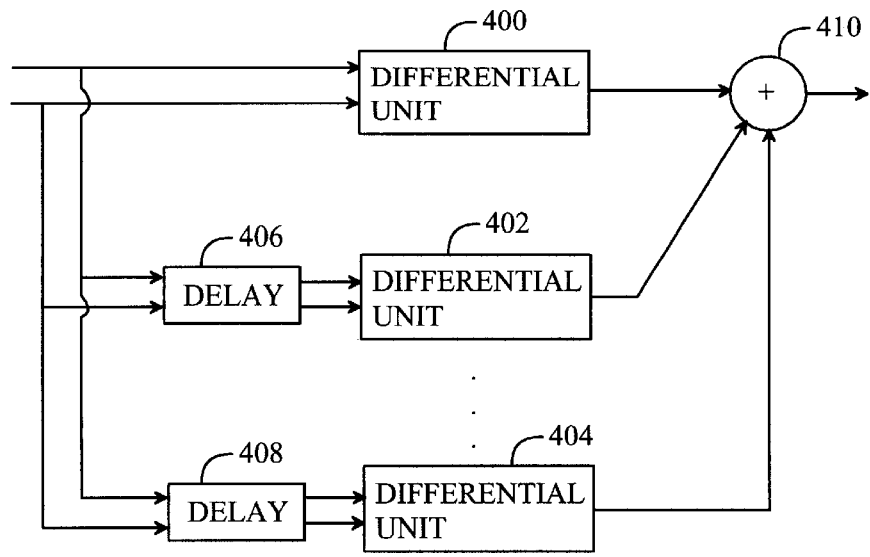
FIG. 4A shows a block diagram of a configuration for producing cyclic pulses with several cycles.

FIG. 4A shows an arrangement for forming cyclic pulses using a plurality of pairs of differential pairs 400 to 404. Each pair of the differential pairs 400 to 404 includes two differential pairs, each differential pair being similar to for example the pair 106 in FIG. 1 or the like. The input pulses for the pairs of the differential pairs 400 to 404 are delayed by a different delay in delaying circuits 406 to 408. The delay in the delaying components 406 to 408 can be expressed as $\tau_k = k \cdot \tau_{cycle}$, where k is the index of the delay component and k=1, ..., N−1, N is the number of the pairs of differential pairs, $\tau_{cycle}$ is the duration of a primary cyclic pulse generated by one of the pairs of the differential pairs 400 to 404. The delay circuits can also reside after each pair of the differential pairs 402 to 404. The primary cyclic pulses produced by each pair of the differential pairs are combined in a combiner 410, which can be an analog adder or a cross coupling. FIG. 4A illustrates a configuration wherein only one output of each pair of the differential pairs is used in the combination.

Figure 4B:
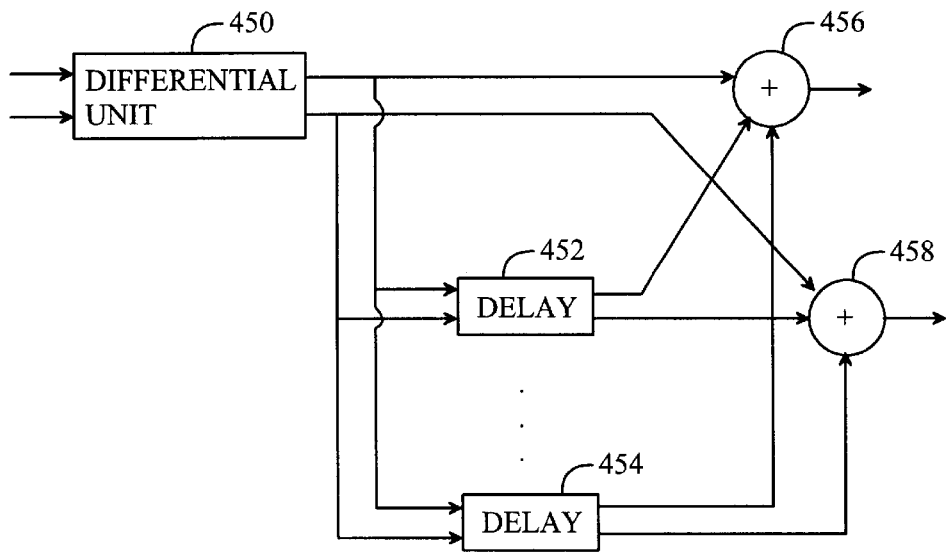
FIG. 4B shows a block diagram of a configuration for producing cyclic pulses with several cycles using a pair of a pair of differential pairs.

Referring to FIG. 4B, cyclic pulses that correspond to the cyclic pulses produced by the configuration of FIG. 4A can also be produced by one pair of differential pairs 450 whose output is delayed N−1 times in delaying circuits 452 to 454. The first delayed primary cyclic pulses are combined in a combiner 456, which can be an analog adder or a cross coupling. The second delayed primary cyclic pulses are combined in a combiner 458, which also can be an analog adder or a cross coupling. Thus, FIG. 4B illustrates a configuration wherein both outputs of each pair of the differential pairs are used in the combination. This kind of combination can also be utilized in the configuration shown in FIG. 4A.

Figure 5:
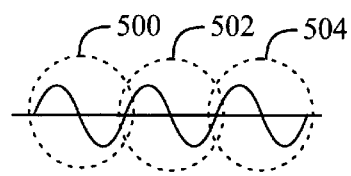
FIG. 5 shows a cyclic pulse with several cycles.

A cyclic pulse which comprises three primary cyclic pulses 500 to 504 is shown in FIG. 5. The number of pairs of differential pairs is three and each of the pairs of differential pairs produces one primary cyclic pulse. The cyclic pulse can also be produced by one pair of the differential pairs and three delays as shown in FIG. 4B. In general, when the primary pulses have desired delays, the combination is a cyclic pulse which has several cycles.

Even though the invention has been described above with reference to an example according to the accompanying drawings, it is clear that the invention is not restricted thereto but can be modified in several ways within the scope of the appended claims.

What is claimed is:

1. A method for generating cyclic pulses, the method comprising:
   inputting a first unipolar pulse to one input of a first differential pair;
   inputting a second unipolar pulse to another input of the first differential pair, the first unipolar pulse and the second unipolar pulse having inversed polarities with respect to each other;
   delaying the first unipolar pulse and the second unipolar pulse;
   inputting the first delayed unipolar pulse to one input of a second differential pair;
   inputting the second delayed unipolar pulse to another input of the second differential pair; and
   forming a cyclic pulse by combining an output signal relating to the first unipolar pulse of the first differential pair with an output signal relating to the second unipolar pulse of the second differential pair.

2. The method of claim 1, the method comprising delaying the first unipolar pulse and the second unipolar pulse by delay periods whose delays are relative to the durations of the pulses.

3. The method of claim 1, the method comprising forming, before inputting the unipolar pulses to the differential pairs, the shape of the unipolar pulses.

4. The method of claim 1, the method comprising combining the output signal relating to the first unipolar pulse of the first differential pair with the output signal relating to the second unipolar pulse of the second differential pair using a cross coupling.

5. The method of claim 1, the method comprising combining the output signal relating to the first unipolar pulse of the first differential pair with the output signal relating to the second unipolar pulse of the second differential pair using analog addition.

6. The method of claim 1, the method comprising generating a sequence of clock pulses;
   forming the first and the second unipolar pulses from the unipolar pulses.

7. The method of claim 1, the method comprising producing the cyclic pulses continuously.

8. The method of claim 1, the method further comprising producing two cyclic pulses of different phases at the same time by combining one output signal relating to the first unipolar pulse of the first differential pair with one output signal relating to the second unipolar pulse of the second differential pair, and by combining another output signal relating to the first unipolar pulse of the first differential pair with another output signal relating to the second unipolar pulse of the second differential pair.

9. The method of claim 1, the method comprising producing the cyclic pulses continuously in a transmitter and in a receiver of a UWB radio system.

10. The method of claim 1, the method comprising forming primary cyclic pulses by a plurality of pairs of differential pairs, delaying the primary cyclic pulses of the plurality of pairs of the differential pairs by different delays and forming cyclic pulses with several cycles by combining the primary cyclic pulses of the plurality pairs of the differential pairs.

11. An arrangement for generating cyclic pulses, the arrangement comprising:
   a first differential pair including an input for a first unipolar pulse, and a second input for a second unipolar pulse, the first unipolar pulse and the second unipolar pulse having inversed polarities with respect to each other;
   means for delaying the first unipolar pulse and the second unipolar pulse;
   a second differential pair including an input for the first delayed unipolar pulse, and a second input for the second delayed unipolar pulse; and
   the arrangement is configured to form a cyclic pulse by combining an output signal relating to the first unipolar pulse of the first differential pair with an output signal relating to the second unipolar pulse of the second differential pair.

12. The arrangement of claim 11, wherein the means for delaying are configured to delay the first unipolar pulse and the second unipolar pulse by delay periods whose delays are relative to the durations of the pulses.

13. The arrangement of claim 11, wherein the arrangement further comprises a filter for shaping the unipolar pulses before inputting the unipolar pulses to the differential pairs.

14. The arrangement of claim 11, wherein the arrangement comprises a cross coupling for combining the output signal relating to the first unipolar pulse of the first differential pair with the output signal relating to the second unipolar pulse of the second differential pair.

15. The arrangement of claim 11, wherein the arrangement comprises an analog adder for combining the output signal relating to the first unipolar pulse of the first differential pair with the output signal relating to the second unipolar pulse of the second differential pair.

16. The arrangement of claim 11, wherein the arrangement comprises a clock for generating a sequence of clock pulses;

means for forming the first and the second unipolar pulses from the clock pulses.

17. The arrangement of claim 11, wherein the arrangement is configured to produce the cyclic pulses continuously.

18. The arrangement of claim 11, wherein the arrangement is configured to produce two cyclic pulses of different phases at the same time by combining one output signal relating to the first unipolar pulse of the first differential pair with one output signal relating to the second unipolar pulse of the second differential pair, and by combining another output signal relating to the first unipolar pulse of the first differential pair with another output signal relating to the second unipolar pulse of the second differential pair.

19. The arrangement of claim 11, wherein the arrangement is configured to produce the cyclic pulses continuously in a transmitter and in a receiver of a UWB radio system.

20. The arrangement of claim 11, wherein the arrangement comprises a plurality of pairs of differential pairs for forming primary cyclic pulses, delaying means for delaying the primary cyclic pulses of the plurality of pairs of the differential pairs by different delays and means for combining the primary cyclic pulses of the plurality of pairs of the differential pairs in order to form cyclic pulses with several cycles.

\* \* \* \* \*